United States Patent [19]

Honkasalo et al.

[11] Patent Number: 5,331,638
[45] Date of Patent: Jul. 19, 1994

[54] GAIN CONTROL IN A TDMA RADIO-TELEPHONE SYSTEM

[75] Inventors: Harri Honkasalo, Salo; Harri Jokinen, Hiisi; Seppo Lamberg, Salo, all of Finland

[73] Assignee: Nokia Mobile Phones Ltd., Salo, Finland

[21] Appl. No.: 820,276

[22] Filed: Jan. 14, 1992

[30] Foreign Application Priority Data

Jan. 15, 1991 [FI] Finland .................................. 910212

[51] Int. Cl.⁵ .............................................. H04B 7/26
[52] U.S. Cl. .................................. 370/95.1; 370/95.3; 375/98; 455/234.1; 455/245.1
[58] Field of Search ............... 455/226.1, 232.1, 234.1, 455/245.1; 375/76, 98; 370/95.1, 95.3

[56] References Cited

U.S. PATENT DOCUMENTS

| | | | |
|---|---|---|---|
| 4,656,630 | 4/1987 | Miyo | 370/95.3 |
| 4,757,502 | 7/1988 | Meuriche et al. | 375/98 |
| 5,119,508 | 6/1992 | Shamasundara | 455/234.1 |
| 5,184,349 | 2/1993 | Riordan | 375/98 |

FOREIGN PATENT DOCUMENTS

| | | |
|---|---|---|
| 58069/90 | 10/1992 | Australia . |
| 0366025A2 | 5/1990 | European Pat. Off. . |
| 0411756A2 | 2/1991 | European Pat. Off. . |
| 0455388A2 | 11/1991 | European Pat. Off. . |

OTHER PUBLICATIONS

Proceedings of the 1990 Bipolar Circuits and Technology Meeting, Sep. 1990, pp. 248-251, IEEE, I. A. Koullias et al., "A 100 MHz IF Demodulator for GSM Cellular Radio Mobile Terminals".

*Primary Examiner*—Wellington Chin
*Attorney, Agent, or Firm*—Perman & Green

[57] ABSTRACT

In a radio-telephone system based on time-division multiple access, the AGC function of the receiver can be controlled so as to be approximating the actual value at the beginning of the reception timeslot. The field strength of a specific signal transmitted by a base station during a timeslot preceding a concerned reception timeslot is measured, the specific signal having a power the ratio of which to the power of the concerned signal is presumed. On the basis of this measured field strength and the presumed ratio, the required AGC gain of the AGC amplifiers is calculated and the AGC gain is set according to the calculated gain for the time of the concerned reception timeslot.

9 Claims, 1 Drawing Sheet

GAIN CONTROL IN A TDMA RADIO-TELEPHONE SYSTEM

FIELD OF THE INVENTION

This invention relates to a manner in which the AGC function of the receiver in a time-division multiple access (TDMA) radio-telephone system can be controlled so as to be approximately the actual value at the beginning of the receiving interval.

BACKGROUND OF THE INVENTION

In the pan-European digital cellular radio system known as Groupe Speciale Mobile (GSM) each of the RF channels is divided into timeslots of approximately 0.577 ms duration. The modulating bit rate for a GSM carrier is 270.838 kbit/s which means that the timeslot 2 in FIG. 1 corresponds to 156.25 bit durations. During this time period the RF carrier is modulated by a data stream, the extent of which is termed a "burst". In other words, a burst represents the physical content of a timeslot. The timeslots 2 are grouped together in sets of eight consecutive timeslots as one TDMA frame 1, as illustrated in FIG. 1. (TDMA is an acronym for time division multiple access). A physical channel is defined by specifying both a RF channel (or, in the case of frequency hopping, a sequence of RF channels) and a TDMA frame timeslot number. Hence for a given RF channel the system has available to it eight physical channels.

There are two main types of logical channels within the GSM system known respectively as traffic channels (TCHs) and control channels (CCHs). The traffic channels are intended primarily to carry encoded speech or user data, whereas the control channels carry signalling and synchronization data between the base station and the mobile station e.g. mobile telephone. The control channels include data which instructs the mobile station in which timeslots they are to receive bursts i.e. "concerned reception timeslot" and data from which the mobile station derives its timing. Because of the TDMA, the transmission rate of the radio path is very high, the multipath propagation specific for the radio path appears during the reception as a rapid Rayleigh fading of the envelope of the RF signal, and also as interference between the detected bits, in other words, the field strength received by the mobile telephone varies very rapidly. In order to take account of this, it is conceivable that the received signal is the sum of independent Rayleigh-fading signals and signals having a different delay, and the reception can be planned accordingly. Since the multipath propagation causes linear distortions on the channel, a linear receiver is needed in a digital radio-telephone to allow correction of these distortions. In this case, automatic gain control (AGC) has to be used in the receiver amplifiers, aiming at keeping the level of the received signal constant before the Analog-to-Digital Converters (ADC's) 4. In digital radio-telephones, the AGC function is generally accomplished in the same way as in AM or SSB receivers, in which the AGC is accomplished by using an adjustable amplifier 3 controlled with analogue voltage Vc as an intermediate frequency amplifier, which attenuates the signal the more, the greater its amplitude. The characteristics of the actual AGC amplifiers and their positioning in the receiver will not be discussed here.

FIG. 2 is a schematic circuit diagram showing AGC in a typical cellular radio receiver system.

In a TDMA system, for instance a GSM system, the dynamic range of the AGC amplifier 3 must be wide, as does the maximal gain, in order to prevent deterioration of the signal/noise ratio as the gain is being reduced. The signal/noise ratio deteriorates because the resolution is not sufficient for pure conversion of a small signal when ADC's are used. As noted above, the signal level is maintained constant before the ADC 4 with the help of an AGC amplifier 3.

Conventionally, the field strength of the received signal is measured and averaged over a specific time span, and thus the mean field strength is calculated. When the required signal level is known, the required gain of the AGC amplifier 3 can be calculated with the aid of the mean field strength.

In a TDMA system this involves a mean calculation of the field strengths of the concerned reception time slots. The mean calculation is typically carried out over a long time span, of the order, for example, of approximately one second. One 4.62 ms frame in GSM has one reception timeslot of a duration of 0.577 ms, as discussed above, which means that the signal power of the concerned reception timeslots are averaged over the course of several frames, and the average obtained is utilised in the AGC. This control method may be sufficient on a traffic channel.

There will be a problem where there is frequency hopping if a frequency identical to a signalling frequency is included in the frequency hopping sequence, because at this frequency the power may be different from the signal power of the other concerned timeslots.

There will also be a problem when a mobile telephone is in a monitoring state, i.e. in which it monitors the paging channel of the base station.

In this situation the gain of the AGC amplifier 3 may be spurious. For example, in a GSM system, a mobile telephone does not have to monitor the paging channel (PCH) continuously—the minimum requirement being to monitor the PCH once in about two seconds. Each time, the telephone monitors this channel for about 20 ms. In fact, the network can instruct the mobile telephone to monitor the PCH more frequently. The field strength of the received signal may however have changed markedly since the previous reception, especially when the mobile telephone is in a rapidly moving vehicle. In this case, the mean calculation of field strength measurements made during the monitoring of the PCH yields a very poor idea of the field strength prevailing since the previous measurement.

SUMMARY OF THE INVENTION

According to the present invention, there is provided a method for determining the AGC gain of a radio-telephone receiver for a concerned reception timeslot in a mobile telephone system based on time-division multiple access, in which the base station transmits, at least at one frequency, either continuously or at least at a given moment, a specific signal having a power the ratio of which to the power of the concerned signal is presumed, characterized in that during a timeslot preceding the concerned timeslot, the field strength of the specific signal transmitted by the base station is measured, and on the basis of the measured field strength, and the presumed ratio the required AGC gain is calculated and the AGC gain is set according to the calculated gain for the time of the concerned reception timeslot.

This has the advantage that the above mentioned drawbacks in AGC can be considerably reduced and in which the gain of the receiver amplifier has been preset to a value approximating the actual value as the reception starts, so that the level of the received signal before the ADC is substantially correct from the very beginning.

The described method has the advantage of yielding a most accurate estimation of the field strength during the concerned reception timeslot, the estimation being based on a measurement carried out near the reception time slot or immediately before it. The measurement can be done at the end of the timeslot preceding the reception timeslot, and thus the gains of the AGC amplifiers will be set very accurately. This is advantageous, because the more exact the determination of the gain of the AGC amplifier 3, the less dynamic range is required of the elements subsequent to the AGC amplifier 3 of the receiver.

The invention is based on the observation that the TDMA system configuration enables the signal power transmitted in a timeslot preceding the concerned reception timeslot to be measured. Thus, before the actual concerned timeslot, the telephone premonitors this timeslot during a timeslot in which the signal frequency is equal to the signal frequency to be received during the actual concerned reception timeslot, and during which the received power is known, or the ratio of the received power to the power of the concerned reception timeslot is at least basically known from the previous measurements in the premonitored and the actual timeslots in previous TDMA frames. Alternatively, this ratio can be chosen to be one-on the assumption that the field strength of the signal received during the concerned reception timeslot is equal to the measured field strength.

When the telephone measures the field strength of the signal received during this timeslot this measurement can be utilised for the assessment of the actual power received during the reception timeslot, and for calculating the appropriate gain value for the AGC amplifier 3. In this manner, the gain of the AGC amplifier 3 is set with sufficient accuracy at the very beginning of the concerned reception timeslot, since the control of the AGC amplifier 3 is based on a measurement carried out at a moment that is very near the concerned timeslot. The most advantageous case is the one in which the power is measured in the timeslot immediately preceding the concerned reception timeslot-preferably at the end of this timeslot.

The invention will now be described, by way of example only, with reference to the accompanying drawings, of which:

DETAILED DESCRIPTION OF THE INVENTION

Figure 1:
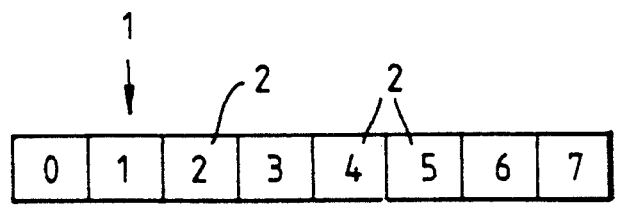
FIG. 1 is a schematic representation of a TDMA frame.
Figure 2:
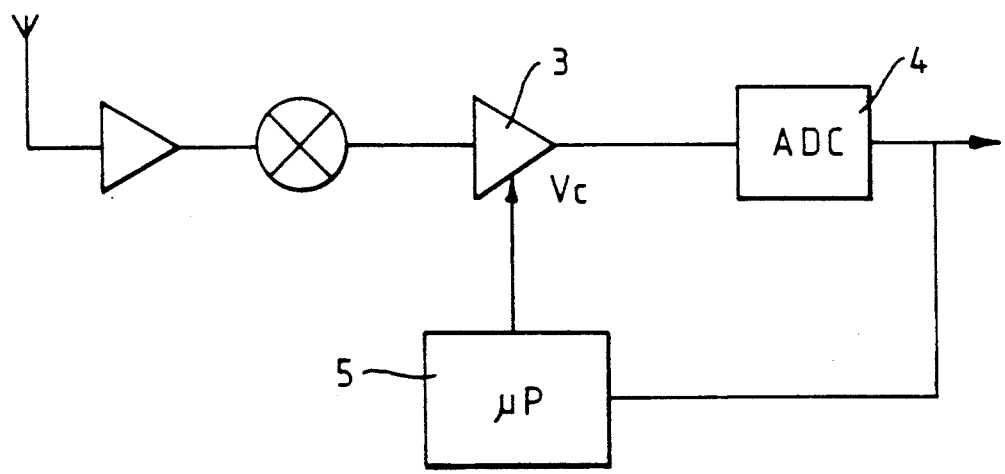
FIG. 2 is a circuit diagram illustrating AGC of a mobile telephone receiver.

Using a GSM mobile system as an example:

In this system, although the broadcast control channel (BCCH) signal power of neighbouring base stations is monitored by the mobile telephone for a possible handover, the measurement of the BCCH signal power of the mobile telephones' own base station is not monitored. Each base station also transmits a signal, at the same frequency as the BCCH, which has a constant power from one timeslot to another, to a mobile telephone, on, for example, a PCH. The field strength of the concerned reception timeslot can be determined with great accuracy by premonitoring, i.e. by measuring, just before the concerned reception timeslot, the field strength of a signal at the BCCH frequency transmitted with constant power by the mobile telephone's own base station, and this field strength is utilised for presetting the gain of the AGC amplifier 3. This field strength is a very exact estimation of the field strength of the concerned reception timeslot, provided that it has been measured just before the concerned reception time slot and its frequency is identical to the reception frequency of the concerned reception timeslot. The power is sampled in a known manner and the gain of the AGC amplifier 3 is controlled by the processor 5 of the telephone, again in a known manner.

The method according to the invention can be used in at least three cases, discussed below.

Firstly this method can be used when the frequency of the signal to be received during the concerned reception timeslot is identical to the BCCH frequency and the reception takes place continuously at this frequency. Then the power of this signal is measured just before the concerned reception interval and the AGC gain is controlled in accordance with the measured power.

A second and major case is in frequency hopping. In a speech situation, i.e. when a mobile telephone is on a traffic channel, the GSM system uses frequency hopping, i.e. wherein the transmit and receive frequencies may both vary from one frame to another. This gives an improvement of the speech quality when the mobile telephone is in a local dead spot, although frequency hopping can be used at other times too. In frequency hopping, one frequency included in the frequency hopping sequence may be precisely the BCCH frequency mentioned above. The signal power received at this frequency may be very different from the signal power of the other concerned timeslots receiving speech or data. The situation is aggravated by the fact that the historical knowledge of the average signal power of the BCCH frequency is extremely poor, since there is a long lapse from the previous reception at this frequency, i.e. there are very few samples of the BCCH frequency per time unit. Accordingly, a signal at the BCCH frequency is premonitored and its signal power is measured just before the actual reception timeslot. The measurement is immediately utilised for adequate setting of the gain of the AGC amplifier 3 in view of the actual reception time slot, during which speech or data will be received. Since the timeslot is at the same frequency as the signalling timeslots, the premonitoring explained above can be utilised for frequency hopping.

A third application of the invention is where the mobile telephone is in the idle paging state. In this state, the telephone receives only signals transmitted at the BCCH frequency from the base station. Thus, each time the telephone starts monitoring at this BCCH frequency, the power of the signal at the BCCH frequency is again premonitored before the actual reception timeslot and the AGC gain is set to the actual value as the reception starts.

The setting of the gain of the AGC amplifier 3 on the basis of the signal power at the BCCH frequency preceding the reception timeslot can be done in various ways.

The simplest solution is to set the AGC gain directly according to the measured power, i.e. this assumes that the power received during the concerned reception time slot is equal to the measured power.

It is possible to use other methods as well. For example if the ratio of the signal power received by the telephone to the measured power in the concerned reception timeslot is at least basically known from previous TDMA frames, the required gain of the AGC amplifier 3 can, for the current concerned reception timeslot, be calculated on the basis of this historical ratio and the power measured by premonitoring the timeslot concerned.

We claim:

1. A method for determining AGC gain of a radio-telephone receiver for a concerned reception timeslot in a mobile telephone system based on time division multiple access, in which a local base station transmits either continuously or at least at a given moment, a specific signal having a constant power and having the same frequency as a control signal employed by said local base station, the ratio of the power of said specific signal to the power of a signal in the concerned reception time slot is presumed, characterized in that during a timeslot preceding the concerned reception timeslot wherein said radio telephone receiver does not monitor transmissions of said control signal from said local base station, the field strength of the specific signal transmitted by the local base station is measured, and on the basis of the measured field strength and the presumed ratio, the required AGC gain is calculated and the AGC gain is set according to the calculated gain for the time of the concerned reception timeslot.

2. A method according to claim 1, characterized in that the AGC gain is calculated on the basis the presumed ratio is unity supposing that the field strength of the signal received during the concerned reception timeslot is equal to the measured field strength.

3. A method according to claim 1 characterized in that the presumed ratio for the concerned timeslot is based on values of the ratio determined previously.

4. A method according to claim 1, characterized in that the said measurement is carried out during the timeslot immediately preceding the reception timeslot concerned.

5. A method according to claim 4, characterized in that the said measurement is carried out at the end of the timeslot immediately preceding the concerned reception timeslot.

6. A method according to claim 1, characterized in that the telephone is adapted to receive continuously, at the same frequency at which the base station transmits the said specific signal, wherein the measurement is carried out before each concerned reception timeslot.

7. A method according to claim 1, characterized in that the telephone is adapted to receive signals in a frequency hopping mode, wherein the measurement is carried out before the concerned reception timeslot when the frequency of the received specific signal is equal to one of the said signals transmitted by the base station.

8. A method according to claim 1, characterized in that the measurement is carried out before each concerned reception timeslot when the telephone is in an idle state.

9. A method according to claim 1, characterized in that the said specific signal is a signal transmitted at the same frequency as a broadcast control channel signal of said base station but over a control channel that is monitored by said radio-telephone receiver.

* * * * *